US006388334B1

(12) United States Patent
Birdsley

(10) Patent No.: US 6,388,334 B1
(45) Date of Patent: May 14, 2002

(54) SYSTEM AND METHOD FOR CIRCUIT REBUILDING VIA BACKSIDE ACCESS

(75) Inventor: Jeffrey D. Birdsley, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/361,464

(22) Filed: Jul. 27, 1999

(51) Int. Cl.[7] ................................................ H01L 23/48
(52) U.S. Cl. ..................... 257/778; 257/374; 257/523; 257/524; 257/623; 257/774
(58) Field of Search ....................... 257/48, 374, 523, 257/524, 520, 622, 623, 621, 774, 777, 778, 737

(56) References Cited

U.S. PATENT DOCUMENTS

| 4,575,921 A | * | 3/1986 | Bhagat ........................... 29/571 |
| 5,492,851 A | * | 2/1996 | Ryou ............................. 437/52 |
| 5,612,552 A | * | 3/1997 | Owens ........................... 257/211 |
| 5,883,000 A | * | 3/1999 | Pasch ........................... 438/618 |
| 5,889,306 A | * | 3/1999 | Choctensen et al. ........ 257/350 |
| 5,965,917 A | * | 10/1999 | Maszara et al. ............. 257/382 |
| 6,037,625 A | * | 3/2000 | Matsubara et al. .......... 257/382 |
| 6,171,917 B1 | * | 1/2001 | Sun et al. .................... 438/305 |
| 6,187,619 B1 | * | 2/2001 | Wu ............................ 438/224 |

OTHER PUBLICATIONS

J. Melngailis et al. "The focused ion beam as an integrated circuit restructuring tool", 1985, pp. 176–180.

* cited by examiner

Primary Examiner—Fetsum Abraham

(57) ABSTRACT

A circuit modification tool and method for a flip-chip IC permits access to circuit regions near the interconnects using an aperture formed through the circuit side. In one embodiment, an etching tool is adapted to remove substrate from the backside of the semiconductor devices and to form a via into the circuit side and beyond a first region in the circuitry. A depth indicating the location of the first region is determined, and a focused ion-beam generator is used to modify a second region in the circuit side using the via for access. After the modification, the first region is rebuilt using the via for access.

20 Claims, 4 Drawing Sheets

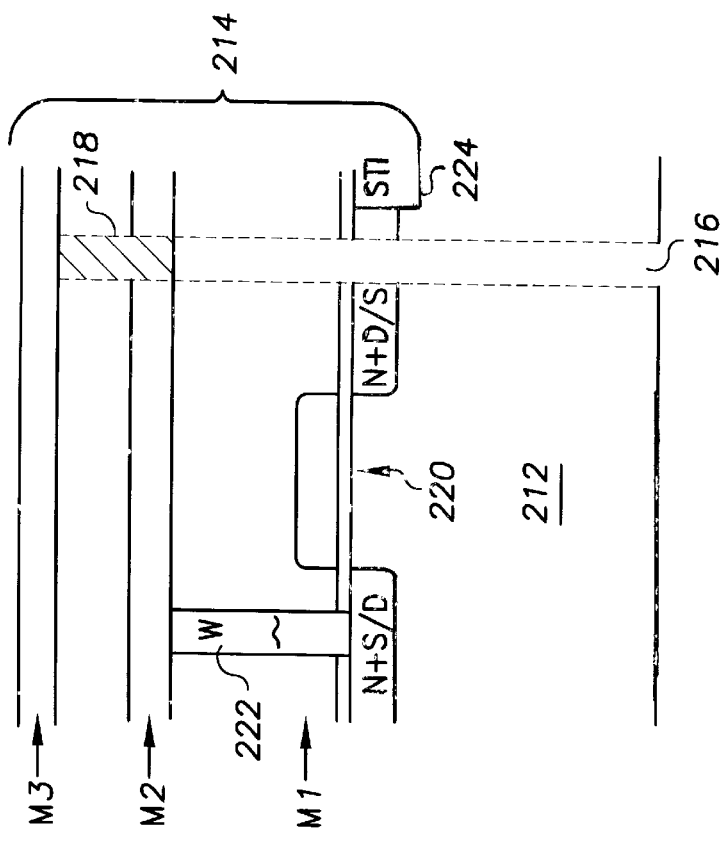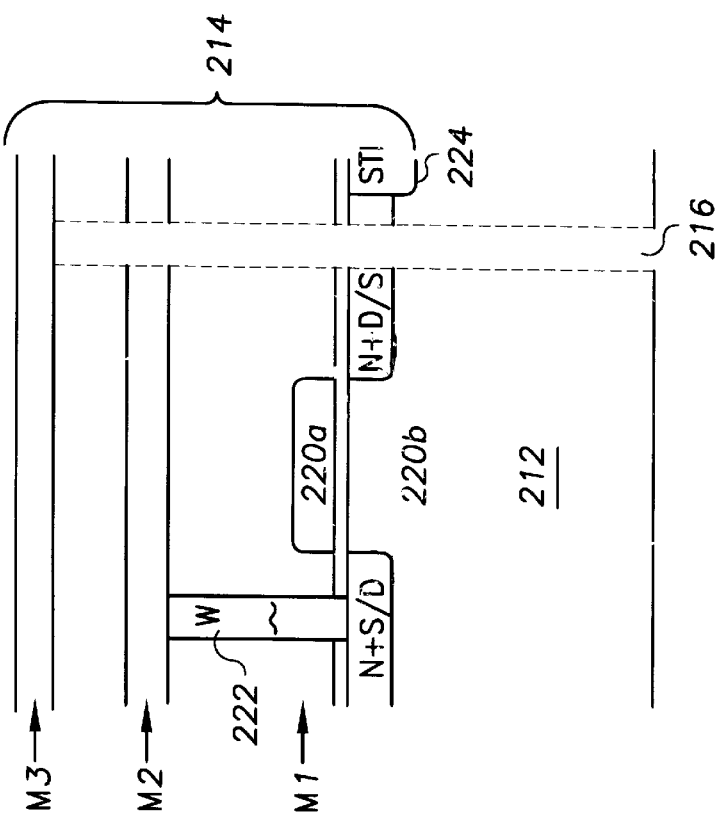

SYSTEM AND METHOD FOR CIRCUIT REBUILDING VIA BACKSIDE ACCESS

RELATED PATENT DOCUMENTS

The present application is related to concurrently filed patent application Ser. No. 09/383,790 Ring et al., entitled "Arrangement and Method for Characterization of FIB Insulator Deposition" and to patent applications, Ser. No. 09/187,314, Birdsley et al., filed on Nov. 4, 1998, now U.S. Pat. No. 6,146,014 entitled "Method for Laser Scanning Flip-Chip Integrated Circuits" and application Ser. No. 09/074,627, Gilfeather et al., filed on May 7, 1998, entitled "Method and Article for Bringing Up Lower Level Metal Nodes of Multi-layered Integrated Circuits for Signal Acquisition". These related patent documents are assigned to the assignee of the present invention, incorporated herein by reference, and priority to each of these applications is claimed for common subject manner thereto.

FIELD OF THE INVENTION

The present invention relates generally to the manufacture and analysis of semiconductor devices and, more particularly, to the reconfiguration of such devices after their initial construction.

BACKGROUND OF THE INVENTION

In recent years, the semiconductor industry has realized tremendous advances in technology which have permitted dramatic increases in circuit density and complexity, and equally dramatic decreases in power consumption and package sizes. Present semiconductor technology now permits single-chip microprocessors with many millions of transistors, operating at speeds of hundreds of MIPS (millions of instructions per second) to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

To increase the number of pad sites available for a die, different chip packaging techniques have been used. One of many related package types is called "controlled-collapse chip connection" or "flip chip" packaging, and uses bonding pads and metal (solder) bumps. The bonding pads need not be on the periphery of the die and hence are moved to the site nearest the transistors and other circuit devices formed in the die. As a result, the electrical path to the pad is shorter. Electrical connection to the package is made when the die is flipped over the package with corresponding bonding pads. Each bump connects to a corresponding package inner lead. The resulting packages have a lower profile and have lower electrical resistance and a shortened electrical path. The output terminals of the package may be ball-shaped conductive-bump contacts (usually solder, or other similar conductive material) are typically disposed in a rectangular array. These packages are occasionally referred to as "Ball Grid Array" (BGA) packages. Alternatively, the output terminals of the package may be pins; such a package is commonly known as a Pin Grid Array (PGA) package.

For BGA, PGA and other types of packages, once the die is attached to the package, the backside portion of the die remains exposed. The transistors and other circuitry are generally formed in a very thin epitaxially grown silicon layer on a single crystal silicon wafer from which the die is singulated. The side of the die including the epitaxial layer containing the transistors, and the other active circuitry, is often referred to as the circuit side of the die or front side of the die. The circuit side of the die is positioned very near the package and opposes the backside of the die. Between the backside and the circuit side of the die is single crystalline silicon. The positioning of the circuit side provides many of the advantages of the flip chip.

In some instances, the orientation of the die with the circuit side face down on a substrate may be a disadvantage or present new challenges. For example, when a circuit fails or when it is necessary to modify a particular chip, access to the transistors and circuitry near the circuit side is typically obtained only from the backside of the chip. This is challenging since the transistors are in a very thin layer (about 10 micrometers) of silicon buried under the bulk silicon (greater than 500 micrometers). Thus, the circuit side of the flip chip die is not visible or accessible for viewing using optical or scanning electron microscopy.

Techniques have been developed to access the circuit even though the integrated circuit (IC) is buried under the bulk silicon. For example, near-infrared (nIR) microscopy is capable of imaging the circuit because silicon is relatively transparent in these wavelengths of the radiation. However, because of the absorption losses of nIR radiation in silicon, it is generally required to thin the die to less than 100 microns in order to view the circuit using nIR microscopy. For a die that is 725 microns thick, at least 625 microns of silicon is removed before nIR microscopy can be used.

Thinning the die for failure analysis of a flip chip bonded IC is usually accomplished by first globally thinning, wherein the silicon is thinned across the entire die surface. The silicon is globally thinned to allow viewing of the active circuit from the back side of the die using nIR microscopy. Mechanical polishing is one method for global thinning. Using nIR microscopy, an area is identified for accessing to a particular area of the circuit. Local thinning techniques such as laser microchemical etching are used to thin the silicon an area to a level that is thinner than the die size. One method for laser microchemical etching of silicon is accomplished by focusing a laser beam on the backside of the silicon surface to cause local melting of silicon in the presence of chlorine gas. The molten silicon reacts very rapidly with chlorine and forms silicon tetrachloride gas, which leaves the molten (reaction) zone. A specific example silicon-removal process uses the 9850 SiliconEtcher™ tool by Revise, Inc. (Burlington, Mass). This laser process is suitable for both local and global thinning by scanning the laser over a part of, or the whole, die surface.

During failure analysis, or for design debug, it is sometimes desirable to make electrical contact and probe certain circuit nodes on the circuit side or front side of the die, or to reconfigure the conductors in an integrated circuit. For a flip chip die, this would generally involve milling through the backside of the die to access the node, or milling to the node and subsequently depositing a metal on the node. Accurately determining the thickness of the silicon in the backside, however, is not readily determined; and when not controlled properly, can result in destruction of the circuitry that is to be analyzed or debugged.

Unlike a flip-chip die, the upper-level interconnects are immediately accessible via the backside of a normally-oriented die, and several techniques have been developed or explored for use in restructuring such a die. For example, for laser-linking of conductors, special sites have been fabricated consisting of sandwiches of Al, $SiO_2$, amorphous Si, $SiO_2$, and Al, and these sites can be reliably laser-fused to produce a desired short circuit. Laser microchemical etching and deposition have been reported for such reconstruction. For removal of Al, a liquid etchant covers the surface and etching occurs under the laser spot. For the addition of poly-silicon conductors, the circuit is placed in an ambient of 200 Torr of diborane-doped silane gas. The e-beam charging of gates has also been demonstrated as a technique for restructuring integrated circuits or programming EPROM's (erasable programmable read-only memory). For a normally-oriented die, these techniques are burdensome in that each involves undesirable fabrication steps, wet chemistry, unduly large access areas, or relatively high resistance links.

There are additional drawbacks when considering use of the reported techniques for rebuilding a node via backside access in a flip-chip die. For example, accessing an interconnect via the backside of a flip-chip involves not only the above-described access and rebuilding problems but also reaching the interconnect. Because the interconnects are located on the opposite side of the active regions and isolation (e.g. trench isolation) regions that are used to separate the active regions, reaching the interconnects via local thinning results in boring through and destroying these regions.

SUMMARY OF THE INVENTION

The method and apparatus described herein involves a tool adapted to mill through the bulk silicon in the backside of a semiconductor device and to reconstruct circuitry after boring through circuit regions blocking the circuitry to be modified. One embodiment involves determining where the particular areas of the epitaxial regions lie, boring through these epitaxial regions, reconfiguring a target node and then repairing these bored regions by depositing materials such as silicon and trench isolation and implanting dopants in the reverse order as which they were milled.

In a more particular embodiment, a system includes a focused-ion beam (FIB) device having a silicon depositor, a focused-implanter, an oxidizer, and includes a focused localized heating source for annealing and (optionally) a metal deposition device.

In another embodiment, a system includes a focused-ion beam (FIB) device having a silicon depositer, a focused-implanter, an oxidizer, a laser tool for annealing, and (optionally) a metal deposition device.

In yet another embodiment, an apparatus is used for reconstructing a flip-chip semiconductor device having a backside and an opposite circuit side that includes a first region. The apparatus includes: an etching tool for removing substrate from the backside of the semiconductor devices and forming a via into the circuit side and beyond the first region; end point detection for determining a depth indicating the location of the first region; a focused ion-beam generator adapted to reconstruct a second region in the circuit side using the via for access; and a tool that rebuilds the first region using the via for access.

The above summary is not intended to describe each illustrated embodiment or every implementation of the present invention. Other particular embodiments of the invention provide for related methods and more specific implementations. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 2a and 2b show cross-sectional views of a die in various stages of reconstruction according an example method consistent with the present invention.

Figure 1:
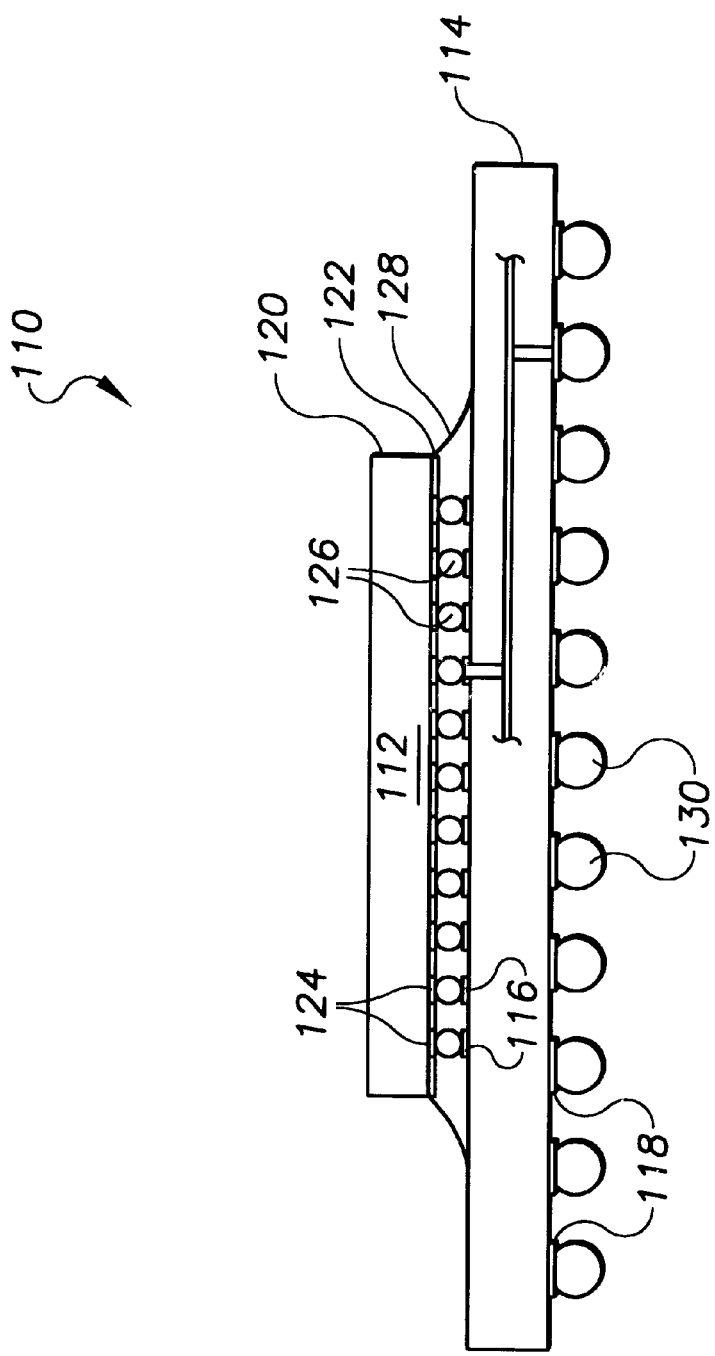
FIG. 1 shows a conventional flip chip device illustrating both a target and end-product of a reconstruction approach, according to an example application of the present invention.

While the invention is amenable to various modifications and alternative forms, specifics thereof have been shown by way of example in the drawings and will be described in detail. It should be understood, however, that the intention is not to limit the invention to the particular embodiment described. On the contrary, the invention is intended to cover the modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for analysis and reconstruction of flip-chip type circuit packages. While the present invention is not limited to flip-chip type circuit packages, an appreciation of various aspects of the invention is best gained through a discussion of using this application.

According to a particular example embodiment of the present invention, a flip-chip packaged semiconductor device is analyzed and reconstructed using an imaging path, or access area, that is formed through the backside of the semiconductor device. A region in the backside of the semiconductor device (also referred to as a die or integrated circuit) is first milled to form the imaging path and to expose a selected region. During the milling process, the materials being milled are monitored to determine the depths at which the material types change. In one specific embodiment, for example, this is accomplished using conventional CAD layout data and a process adapted to detect changes in dopant concentration such as in transitions from bulk substrate to STI or active areas, and in transitions through STI or active areas. By assimilating the layout data with the detected depths at which the dopant concentrations transition, the milling process can be precisely controlled. Once the milling process bores through the bulk substrate and the first region thereafter (e.g., with the STI and active areas), the target node can be modified relative to interaction with adjacent circuitry. If the target node is a certain insulative material, for example, circuit modification can be implemented by doping to effect a less or more conductive function. Subsequent to circuit modification, the aperture formed by the milling process is rebuilt by recreating the various materials in the reverse order in which they were milled.

Such a circuit modification process is applicable to a conventional flip-chip type die such as the die 110 of FIG. 1 shown from a side view along with an attached package substrate 114. Flip-chip die 112 has a backside 120 and a circuit side in a portion of the die known as the epitaxial layer 122. The epitaxial layer 122 includes a number of circuit devices and has a thickness in the range of one to fifteen microns. Bulk silicon fills the backside 120 and is referred to as the bulk silicon layer. A plurality of solder bumps 126 are made on the circuit side at pads 124. The solder bumps 126 are the inputs and outputs to the circuitry associated with the flip-chip type die 112. The flip-chip type die 112 is attached to the package substrate 114 via the solder bumps on the die 112. The package substrate 114 includes pads 116 that are arranged to correspond to the pattern of solder bumps 126 on the die 112. The region between the die 112 and package substrate 114 is filled with an under-fill material 128 that encapsulates the solder bump connections and provides additional mechanical benefits. The pads 116 are coupled via circuitry to pads 118 on the package substrate, and solder bumps 130 are formed on the pads 118. The solder bumps 130 are the inputs and outputs to the circuitry associated with the package substrate 114.

For a flip-chip type die such as die 112 of FIG. 1, failure analysis is usually accomplished using a global and/or local thinning process. Example implementations for such thinning include: mechanically polishing, laser-microchemically etching, and ion bombardment, such as using a focused ion beam (FIB) system. For the above-mentioned circuit modification activity, the die 112 can be globally or locally thinned relatively close to the epitaxial layer 122, at which point the final access path for reconstruction begins.

FIGS. 2a and 2b illustrate a flip-chip die, such as the die 112 of FIG. 1, in two different stages of analysis. FIG. 2a shows a cross-sectional view of the flip-chip die with the bulk silicon substrate 212 shown at the bottom side and opposite circuitry 214 including metal interconnect levels M1, M2 and M3. The stage of the flip-chip die of FIG. 2a is shown after boring, via an etch process, an aperture 216 to access certain target circuitry for modification. In this instance, the target circuitry for modification is an insulative region between metal interconnect levels M2 and M3. The flip-chip die of FIG. 2b shows a cross-sectional view of the same flip-chip die after the insulative region between metal interconnect levels M2 and M3 is modified by forming a conductor 218.

The skilled artisan will appreciate that the circuitry shown in FIGS. 2a and 2b is merely to illustrate an example circuit in which the present invention is applied. This particular example circuitry includes, in addition to the metal interconnect levels M1, M2 and M3, a conventional MOS transistor 220 with gate 220a and active regions 220b, a tungsten plug 222, and shallow trench isolation (STI) regions 224 arranged to isolate adjacent active areas such as the type 220b. The circuit modification illustrated in connection with FIG. 2b is not intended to typify a particular circuit functionality, but rather to illustrate example methodology according to the present invention.

In other example circuit modification applications, metal interconnects are opened, accessed for analysis, repaired, and silicon deposited in milled aperture areas are doped (e.g., using phosphorus or boron) and then laser annealed to effect the desired doping to form the pertinent transistor regions. To complete the modification of the milled materials in the die of FIG. 2b, for example, formation of the conductor 218 is followed by the deposition of a thin oxide and then a layer of silicon. This last silicon layer is then embedded with N+ dopant and then annealed to complete the circuit modification.

Figure 3:
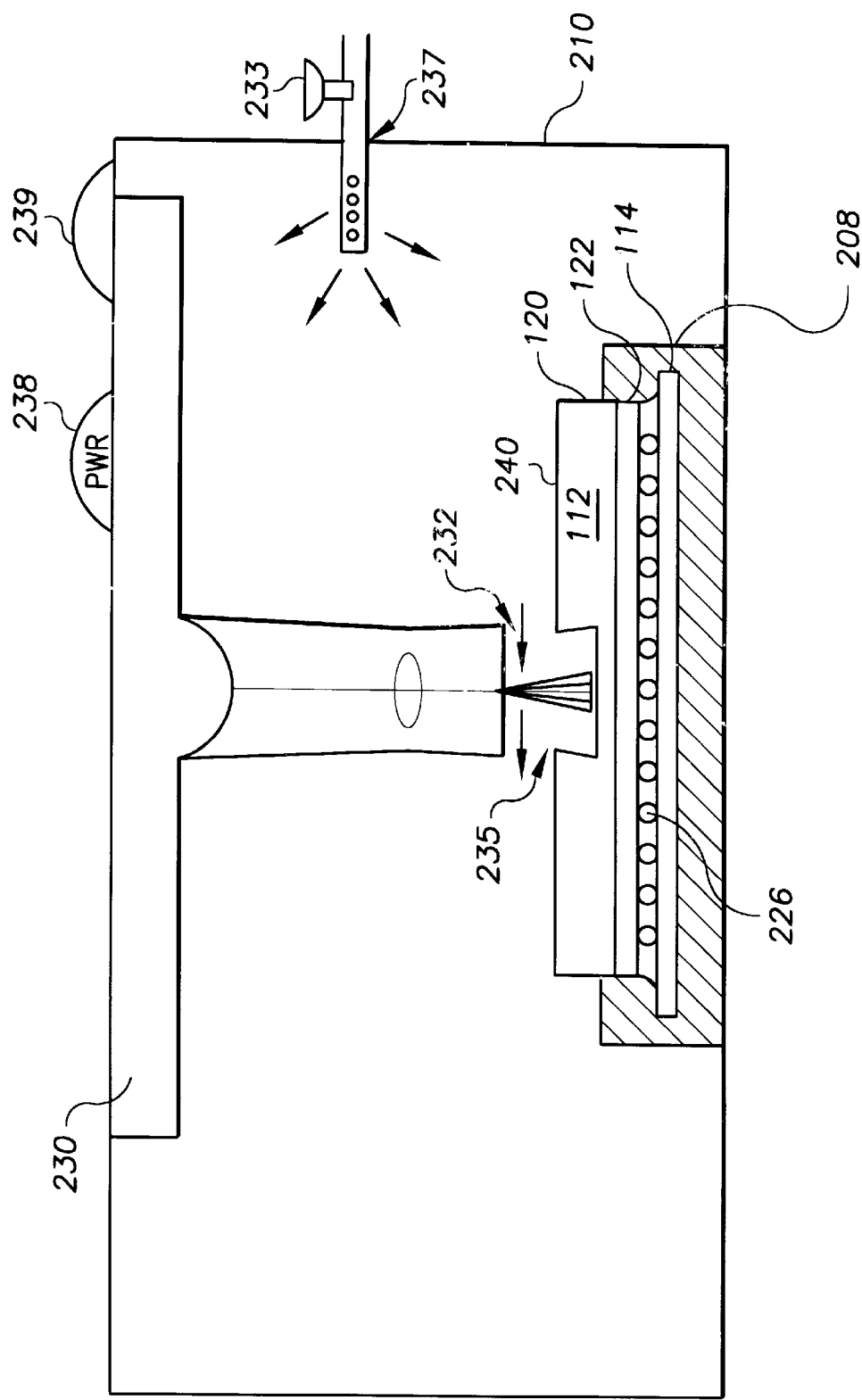
FIGS. 3 and 4 illustrate an example tool for reconstructing a die, also according to the present invention.
Figure 4:
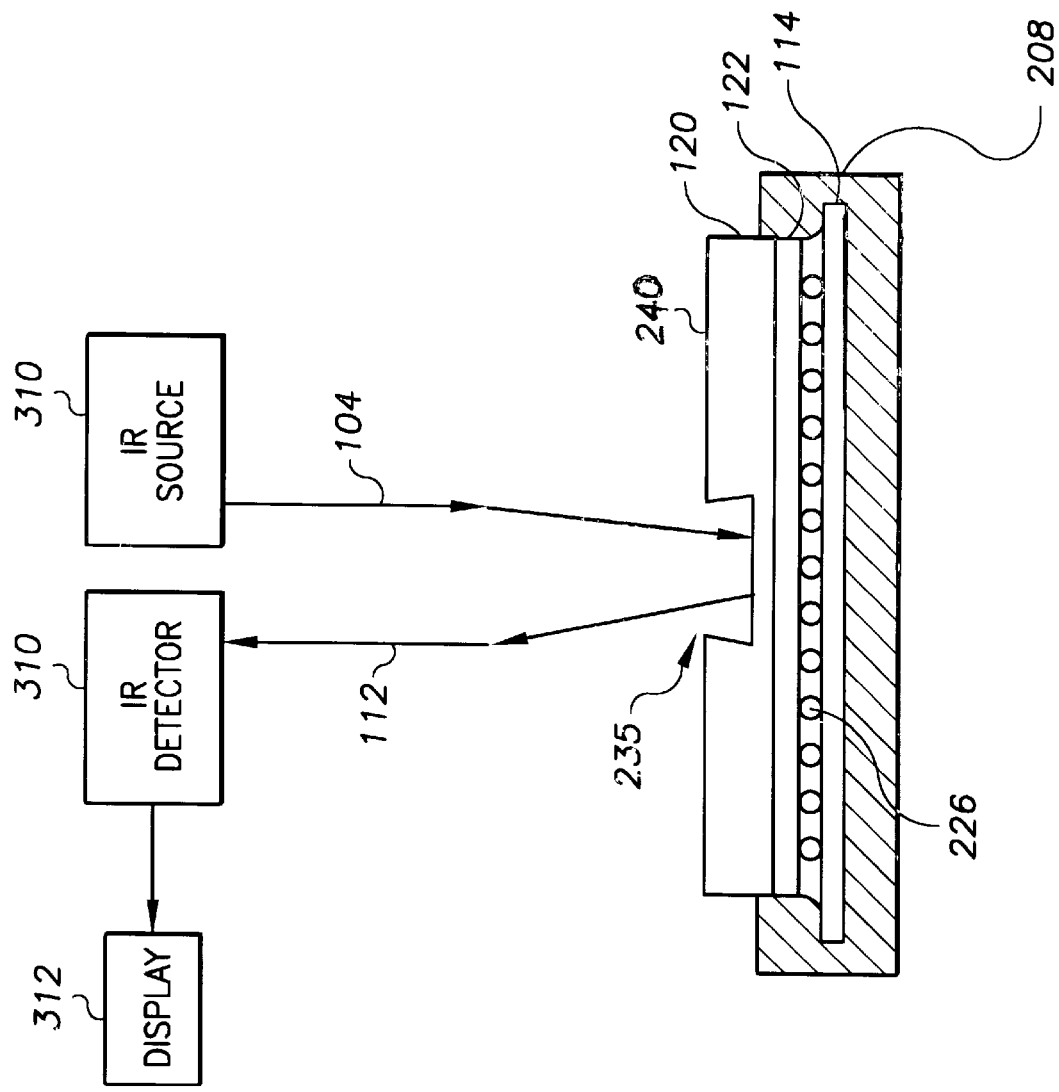

FIGS. 3 and 4 show a schematic view of an example circuit modification system in which substrate 120 of flip-chip type die 112, as attached to a package substrate 114, is secured in a fixture 208 within a chamber 210. The system includes an apparatus 230 such as a laser-chemical etching apparatus or a FIB system for thinning the die 212 by removing portions of the backside 120 of the die 112. The apparatus 230 produces a laser beam 232 which, in the presence of a gas that is reactive with the substrate, can be used to locally or globally thin the die, such as to remove silicon across a selected portion or the entire backside of surface 240.

In the example system of FIG. 3, the reactive gas is provided by way of gas-input port 237 to the chamber 210. A trench 235 in this illustrated example application is provided by locally-thinning a portion of the die 112. In another application, the backside 120 is first globally thinned and then locally thinned to form a final access path into the epitaxial region.

Recreation of insulative material and conductive material is accomplished, according to one example embodiment, using an ion bombarder such as a focused ion beam machine with selective concentrations of conductive ions such as Gallium. The same type of equipment can be used for silicon (also metal and oxide) deposition, focused implantation and modified to include a laser annealing operation. One such commercially available device able to perform each of these aspects is a FC-type FIB system available from Micrion, Inc. of Peabody, Mass. This type of system is particularly advantageous, because it can be used to complete various aspects of process embodiments according to the present invention. These aspects include, for example, etching, navigation and measurements via the system's built-in nIR microscopy, and forming the type of probe discussed above.

For further information concerning an example controlled deposition of insulative material and conductive material in such access paths, reference may be made to the above-mentioned patent document Ser. No. 09/383,790 Ring et al., entitled "Arrangement and Method for Characterization of FIB Insulator Deposition". This above-mentioned patent document discusses endpoint detection for the formation of probes that comprise a conductive Gallium core and a surrounding insulative material. By controlling the inclusion of Gallium ions, for example, as described therein, such probes (as well as isolation regions) can be formed for precise connectivity between target nodes.

The apparatus 230 of FIG. 3 includes adjustment controls 238 and 239 for respectively adjusting the power and scan speed of the etching apparatus 230. Gas-input port(s) 237 to the chamber 210 includes a valve 233 for adjusting the chamber pressure.

FIG. 4 illustrates the nIR microscopy aspects of apparatus 230 of FIG. 3. More specifically, the apparatus 230 of FIG. 3 includes an infrared transmitter/receiver 310 and a monitor 312 to capture images during the milling process through the backside 120. An example nIR microscopy apparatus that can be used in this application is a confocal laser scanning microscopy, manufactured and sold by Zeiss, Inc. To minimize process steps and to integrate such functionality into a single machine, the FC-type FIB system, which incorporates a built-in nIR microscopy arrangement, is preferred.

During the milling process, and at any point in the reconstruction process, images and signals are obtained to further evaluate the die using, for example, a conventional test fixture such as described in connection with U.S. Pat. application entitled "Endpoint Detection For Thinning A Flip Chip Bonded Integrated Circuit," by Jeff Birdsley, Ser. No. 09/247,002, now U.S. Pat. No. 6,255,124 filed Feb. 8, 1999, and herein incorporated by reference in its entirety.

The various embodiments described above are provided by way of illustration only and are not intended to limit the invention. Those skilled in the art will readily recognize various modifications and changes that may be made to the present invention, without strictly following the example embodiments and applications illustrated and described herein. Thus, the present invention is not limited by the example embodiments; rather, the scope of the present invention is set forth in the following claims.

What is claimed is:

1. An apparatus for circuit-modification of a flip-chip semiconductor device having a backside and an opposite circuit side that includes a first region, comprising:

means for removing substrate from the backside of the semiconductor devices;

means for determining a depth indicating the location of the first region;

means for forming a via into the circuit side and beyond the first region;

means for modifying a second region in the circuit side using the via for access; and means for rebuilding the first region using the via for access.

2. The apparatus of claim 1, wherein the means for rebuilding the first region includes an ion bombarder.

3. The apparatus of claim 1, wherein the first region is at least one of an active region and an isolation region, and wherein the means for rebuilding the first region includes an ion bombarder.

4. The apparatus of claim 1, wherein the second region is a conductor and wherein the means for rebuilding the first region includes an ion bombarder.

5. The apparatus of claim 1, wherein the second region is an insulator and wherein the means for rebuilding the first region includes an ion bombarder.

6. The apparatus of claim 1, wherein the second region is an insulator and wherein the means for rebuilding the first region includes an impurity embedder and means for annealing.

7. The apparatus of claim 1, wherein the means for rebuilding the first region uses a dopant impurity embedder with phosphorus or Boron.

8. The apparatus of claim 1, wherein the means for determining a depth includes means for determining a depth at which the first region has a doping concentration difference.

9. An apparatus for circuit-modification of a flip-chip semiconductor device having a backside and an opposite circuit side that includes a first region, comprising:

an etching tool adapted to remove substrate from the backside of the semiconductor devices and to form a via into the circuit side and beyond the first region;

means for determining a depth indicating the location of the first region;

beam-generation means including a focused ion-beam generator adapted to reconstruct a second region in the circuit side using the via for access; and means for rebuilding the first region using the via for access.

10. An apparatus for circuit-modification of a flip-chip semiconductor device, according to claim 9, wherein the means for determining a depth includes means for determining a depth at which the first region has a doping concentration difference.

11. An apparatus for circuit-modification of a flip-chip semiconductor device, according to claim 10, wherein the focused ion-beam generator is further adapted to deposit silicon.

12. An apparatus for circuit-modification of a flip-chip semiconductor device, according to claim 11, wherein the focused ion-beam generator is further adapted to embed impurities.

13. An apparatus for circuit-modification of a flip-chip semiconductor device, according to claim 12, wherein the beam-generation means is further adapted to anneal.

14. An apparatus for circuit-modification of a flip-chip semiconductor device, according to claim 13, further including a test fixture.

15. A method of circuit-modification of a flip-chip semiconductor device having a backside and an opposite circuit side that includes a first region, comprising:

removing substrate from the backside of the semiconductor devices;

determining a depth indicating the location of the first region;

forming a via into the circuit side and beyond the first region;

modifying a second region in the circuit side using the via for access; and rebuilding the first region using the via for access.

16. A method of circuit-modification of a flip-chip semiconductor device, according to claim 15, wherein modification of a first region in the circuit side includes embedding impurities.

17. A method of circuit-modification of a flip-chip semiconductor device, according to claim 16, wherein modification of a first region in the circuit side includes annealing.

18. A method of circuit-modification of a flip-chip semiconductor device, according to claim 15, wherein modification of a first region in the circuit side includes depositing silicon.

19. A method of circuit-modification of a flip-chip semiconductor device, according to claim 18, wherein modification of a first region in the circuit side includes embedding impurities.

20. A method of circuit-modification of a flip-chip semiconductor device, according to claim 19, wherein modification of a first region in the circuit side includes annealing.

* * * * *

UNITED STATES PATENT AND TRADEMARK OFFICE
CERTIFICATE OF CORRECTION

PATENT NO.     : 6,388,334 B1
DATED          : May 14, 2002
INVENTOR(S)    : Birdsley It is certified that error appears in the above-identified patent and that said Letters Patent is hereby corrected as shown below:

<u>Column 2,</u>
Line 42, "an" should read -- in --.

<u>Column 4,</u>
Line 12, after "according", please insert -- to --.

<u>Column 7,</u>
Line 43, "Boron" should read -- boron --.

Signed and Sealed this

Twenty-third Day of July, 2002

Attest:

Attesting Officer

JAMES E. ROGAN
*Director of the United States Patent and Trademark Office*

UNITED STATES PATENT AND TRADEMARK OFFICE
CERTIFICATE OF CORRECTION

PATENT NO.    : 6,388,334 B1
DATED         : May 14, 2002
INVENTOR(S)   : Birdsley It is certified that error appears in the above-identified patent and that said Letters Patent is hereby corrected as shown below:

Column 2,
Line 42, "an" should read -- in --.

Column 4,
Line 12, after "according" , please insert -- to --.

Column 7,
Line 43, "Boron" should read -- boron --.

Signed and Sealed this

Twenty-second Day of June, 2004

JON W. DUDAS
*Acting Director of the United States Patent and Trademark Office*